(12) United States Patent
Tan et al.

(10) Patent No.: US 8,211,761 B2
(45) Date of Patent: Jul. 3, 2012

(54) SEMICONDUCTOR SYSTEM USING GERMANIUM CONDENSATION

(75) Inventors: Shyue Seng Tan, Singapore (SG); Yung Fu Chong, Singapore (SG); Lee Wee Teo, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 490 days.

(21) Appl. No.: 11/465,005

(22) Filed: Aug. 16, 2006

(65) Prior Publication Data

US 2008/0042209 A1    Feb. 21, 2008

(51) Int. Cl.
 *H01L 21/8238*    (2006.01)
(52) U.S. Cl. ................... 438/199; 257/E21.634
(58) Field of Classification Search ........... 438/128, 438/199, 153; 257/E21.634
See application file for complete search history.

(56) References Cited

U.S. PATENT DOCUMENTS

| | | | |
|---|---|---|---|
| 6,805,962 B2 | 10/2004 | Bedell et al. | |
| 6,906,360 B2 * | 6/2005 | Chen et al. | 257/204 |
| 7,238,581 B2 * | 7/2007 | Chui et al. | 438/301 |
| 2005/0082616 A1 * | 4/2005 | Chen et al. | 257/350 |
| 2005/0098234 A1 | 5/2005 | Nakaharai et al. | |
| 2005/0285192 A1 * | 12/2005 | Zhu | 257/347 |

OTHER PUBLICATIONS

Di, Zengfeng et al., "Fabrication and mechanism of relaxed SiGe-on-insulator by modified GE condensation", J. Vac. Sci. Technol. B, 23(4), Jul./Aug. 2005, pp. 1637-1640.*
The American Heritage College Dictionary, Fourth Edition, Houghton Mifflin, 2004, pp. 298 and 429.*
Ruzyllo, J.; "Semiconductor Glossary"; Prosto Multimedia Publishing; 2004; pp. 102 and 116-117.*
Zengfeng Di, et al., "Fabrication and Mechanism of Relaxed SiGe-on-Insulator by Modified Ge Condensation," American Vacuum Society, J.Vac. Sci. Technol., Jul./Aug. 2005, pp. 1637-1640, v B 23(4).
Tsutomu Tezuka, et al., "High-performance Strained Si-on-Insulator MOSFETs by Novel Fabrication Processes utilizing Ge-Condensation Technique," Symposium on VLSI Technology Digest of Technical Papers, 2002, IEEE.
M. Spadafora et al., "Oxidation Rate Enhancement of SiGe Epitaxial Films Oxidized in Dry Ambient," Nov. 2003, Applied Physics Letters, pp. 3713-3715, v. 83, n. 18, American Institute of Physics.

* cited by examiner

*Primary Examiner* — Stephen W Smoot
*Assistant Examiner* — Vicki B Booker

(57) ABSTRACT

A semiconductor method includes providing a silicon semiconductor substrate. A gate and a plurality of source/drain regions are formed on the silicon semiconductor substrate to form at least one pFET. A silicon-germanium layer is formed over the plurality of source/drain regions. The germanium is condensed from the silicon-germanium layer to form a plurality of source/drains in the plurality of source/drain regions by forming an oxide layer over the silicon-germanium layer. An interlevel dielectric layer is formed over the gate and the source/drain regions. A plurality of contacts is formed in the interlevel dielectric layer to the gate and the plurality of source/drain regions.

13 Claims, 4 Drawing Sheets

SEMICONDUCTOR SYSTEM USING GERMANIUM CONDENSATION

CROSS-REFERENCE TO RELATED APPLICATIONS

The present application contains subject matter related to U.S. patent application Ser. No. 11/016,023, now U.S. Pat. No. 7,238,581.

TECHNICAL FIELD

The present invention relates generally to semiconductor manufacturing, and more particularly to a semiconductor system using germanium condensation.

BACKGROUND ART

Electronic products are used in almost every aspect of life, and the heart of these electronic products is the semiconductor, or integrated circuit. Semiconductor devices are used in everything from airplanes and televisions to wristwatches.

Semiconductor devices are made in and on wafers by extremely complex systems that require the coordination of hundreds or even thousands of precisely controlled processes to produce a finished semiconductor wafer. Each finished semiconductor wafer has hundreds to tens of thousands of semiconductor dies, each worth as much as hundreds or thousands of dollars.

Semiconductor dies are made up of hundreds to billions of individual components. One common component is the transistor. The most common and important semiconductor technology presently used is silicon-based, and the most preferred silicon-based semiconductor technology is a Complementary Metal Oxide Semiconductor (CMOS) technology.

The principal elements of CMOS technology generally consist of a silicon substrate having trench isolation regions surrounding n-channel or p-channel transistor areas. The transistor areas contain polysilicon gates on a silicon oxide dielectric, or gate oxides, over the silicon substrate. The silicon substrate adjacently opposite the polysilicon gate is doped to become conductive. The doped regions of the silicon substrate are referred to as "shallow source/drain regions," or "source/drain extension regions" which are separated by a channel region in the substrate beneath the polysilicon gate. An oxide or nitride spacer, referred to as a "sidewall spacer," on the sides of the polysilicon gate allows deposition of additional doping to form more heavily doped regions of the shallow source/drain regions, which are called "deep source/drain regions." The shallow and deep source/drain regions are collectively referred to as source/drain regions.

To complete the transistor, a dielectric layer is deposited to cover the polysilicon gate, the spacer, and the silicon substrate. To provide electrical contacts for the transistor, openings are etched in the dielectric layer to the polysilicon gate and the source/drain regions. The openings are filled with metal to form electrical contacts. To complete the integrated circuits, the contacts are connected to additional levels of wiring in additional levels of dielectric material to the outside of the dielectric material.

In operation, an input signal to the gate contact to the polysilicon gate controls the flow of electric current from one source/drain contact through one source/drain region through the channel to the other source/drain region and to the other source/drain contact.

Metal oxide semiconductor field effect transistor (MOSFET) devices are well known and widely used in the electronics industry. The carrier mobility of a MOSFET device is an important parameter because of its direct influence on the drive current and switching performance. In standard MOSFET technology, the channel length and gate dielectric thickness are reduced to improve current drive and switching performance. However, reducing the gate dielectric thickness can compromise device performance because of the associated increase in gate leakage current.

It has been shown that in p-channel MOSFETs, or pFETs, a buried silicon-germanium channel region under compressive stress enhances hole mobility in the channel region. Accordingly, a higher drive current can be obtained resulting in faster operating pFETs.

One existing strained channel silicon semiconductor includes strained silicon (Si) on a relaxed Silicon/Germanium (SiGe) substrate to obtain the stresses needed. However, these devices have the disadvantages of self-heating and a tight thermal budget window. A higher strain also is required for pFET transistors to obtain enhanced hole mobility.

One proposed solution involves etching a recess in the area of the source/drain regions and depositing SiGe or silicon/germanium/carbon (SiGeC) in the recess to strain the channel of the transistor. This method involves an additional etching step that adds to the cost of manufacturing the devices.

Another proposed solution involves forming germanium (Ge) on an insulator by oxidation of SiGe on an insulating material, such as an oxide. This approach employs Ge as the channel of the transistor. This approach requires an insulating layer that also adds to the cost of manufacturing the devices.

In the semiconductor industry, there has recently been a high-level of activity using strained Si-based heterostructures to achieve high mobility structures for CMOS applications. One method to implement this has been to grow strained Si layers on thick relaxed SiGe buffer layers.

Despite the high channel electron mobilities reported for heterostructures, the use of thick SiGe buffer layers has several noticeable disadvantages associated therewith. Thick SiGe buffer layers are not typically easy to integrate with existing Si-based CMOS technology. The defect densities are still too high for realistic VSLI (very large scale integration) applications. The nature of the existing systems precludes selective growth of the SiGe buffer layer so that circuits employing devices with strained Si, unstrained Si and SiGe materials are difficult, and in some instances, nearly impossible to integrate.

Furthermore, during the formation of the SiGe epitaxial layer in silicon-on-insulator (SOI) wafers, a thin layer of a Si seed layer is required after source drain reactive ion etch (RIE) to enable growth of the SiGe epitaxial layer. With this approach, controllability of the thickness of the Si seed layer is currently a major concern and this problem becomes even more prominent when the Si layer in SOI is further thinned down, e.g. in FDSOI.

Solutions to these problems have been long sought but prior developments have not taught or suggested any solutions and, thus, solutions to these problems have long eluded those skilled in the art.

DISCLOSURE OF THE INVENTION

The present invention provides a semiconductor method including providing a silicon semiconductor substrate. A gate and a plurality of source/drain regions are formed on the silicon semiconductor substrate to form at least one pFET. A silicon-germanium layer is formed over the plurality of source/drain regions. The germanium is condensed from the silicon-germanium layer to form a plurality of source/drains in the plurality of source/drain regions by forming an oxide layer over the silicon-germanium layer. An interlevel dielectric layer is formed over the gate and the source/drain regions. A plurality of contacts is formed in the interlevel dielectric layer to the gate and the plurality of source/drain regions.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
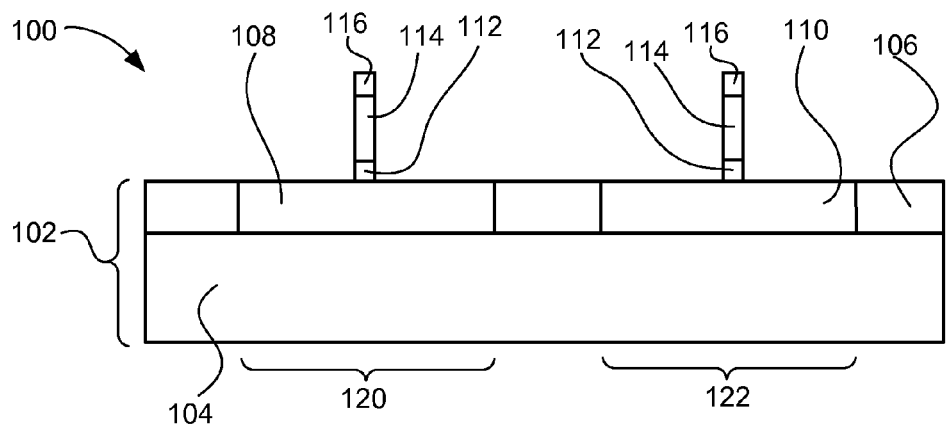
FIG. 1 is a cross sectional view of a semiconductor at an intermediate stage of manufacture in accordance with an embodiment of the present invention.

In the following description, numerous specific details are given to provide a thorough understanding of the invention. However it will be apparent that the invention may be practiced without these specific details. In order to avoid obscuring the present invention, some well-known circuits, system configurations, and process steps are not disclosed in detail.

The drawings showing embodiments of the device are semi-diagrammatic and not to scale and, particularly, some of the dimensions are for the clarity of presentation and are shown greatly exaggerated in the FIGs. Also, the same numbers will be used in all the drawing FIGs. to relate to the same elements.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a cross sectional view of a semiconductor device 100 at an intermediate stage of manufacture in accordance with an embodiment of the present invention. The semiconductor device 100 includes a silicon semiconductor substrate 102, such as a Silicon-On-Insulator (SOI) substrate. In the case of an SOI silicon semiconductor substrate 102 as shown in the FIGs., the silicon semiconductor substrate 102 includes an insulator 104, such as glass, onto which is formed a semiconductor layer 106, such as by deposition. It will be apparent to those skilled in the art that the present invention also is applicable to a silicon semiconductor substrate 102, such as a lightly doped silicon semiconductor substrate of a first conductivity type, for example a p$^-$ doped silicon semiconductor substrate.

A number of trench isolations (not shown) typically are formed in the silicon semiconductor substrate 102 between the area where transistors will be formed to provide electrical separation between the transistors.

A first well 108 of a second conductivity type, such as a p-type well, is formed in certain portions of the silicon semiconductor substrate 102 by a diffusion and/or implant process to provide an area for an n-type MOSFET (nFET) 120. A second well 110 of the first conductivity type, such as an n-type well, is formed in certain other portions of the silicon semiconductor substrate 102 by a diffusion and/or implant process to provide an area for a p-type MOSFET (pFET) 122.

A gate insulating layer 112, such as a gate oxide, is formed over the surface of the silicon semiconductor substrate 102 by forming an insulating layer over the silicon semiconductor substrate and processing the insulating layer to form the gate insulating layer 112. Alternatively, high-k dielectric materials, such as hafnium/aluminum/oxide (HfAlO), which have a higher dielectric constant (k value) compared to silicon dioxide may be used to form the gate insulating layer 112.

A gate 114 is provided by forming a polysilicon layer or a metal layer (to form a metal gate) over the gate insulator 112 and processing the polysilicon layer or metal layer. A cap dielectric 116 is provided by forming a second insulating layer over the gate 114. The cap dielectric 116 can comprise more than one layer of material, such as by forming a silicon dioxide ($SiO_2$) layer followed by the forming of a silicon nitride (SiN) layer. A photoresist layer is deposited on the second insulating layer, patterned, and processed to form a gate mask. The gate mask is processed to form the gate 114 by etching the second insulating layer, the polysilicon layer or metal layer, and the first insulating layer. The unprocessed portion of the second insulating layer forms the cap dielectric 116 that acts as a hard mask over the gate 114.

Figure 2:
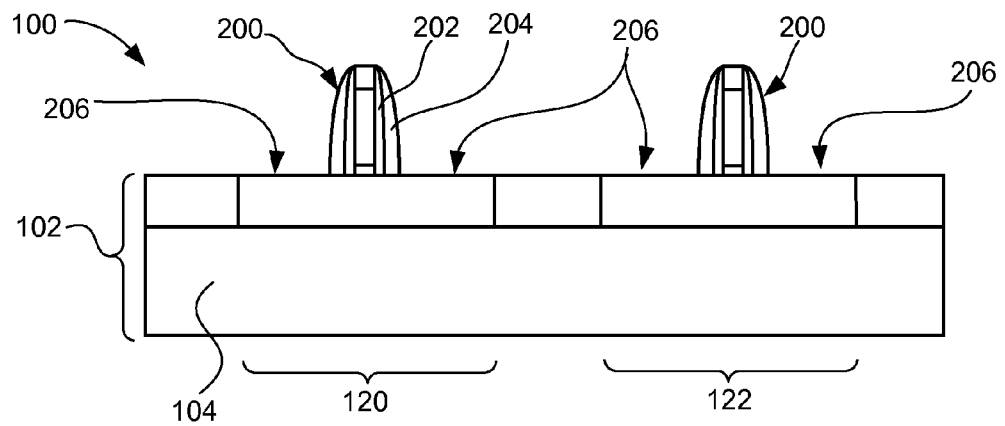
FIG. 2 is the structure of FIG. 1 after formation of sidewall spacers.

Referring now to FIG. 2, therein is shown the structure of FIG. 1 after formation of a number of sidewall spacers 200. The sidewall spacers 200 are formed by providing a layer of an insulating material and processing the layer of insulating material to form the sidewall spacers 200. As shown in FIG. 2, the sidewall spacers 200 comprise a nitride spacer 202 and an oxide spacer 204 over the nitride spacer 202. The sidewall spacers also can be formed of a single insulating material, such as an oxide or a nitride. A number of source/drain regions 206 thus is formed at the surface of the silicon semiconductor substrate 102. The number of source/drain regions 206 may or may not be doped with source/drain dopants at this step.

Figure 3:
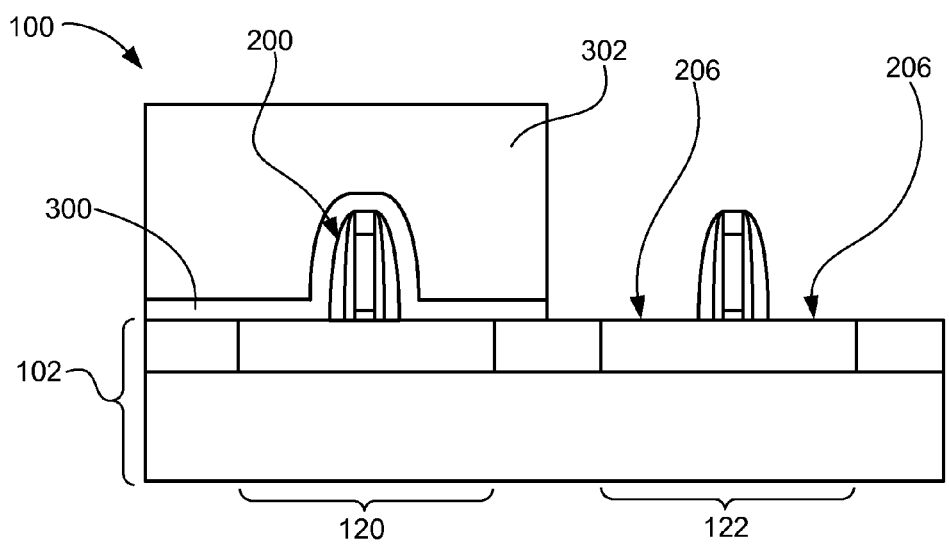
FIG. 3 is the structure of FIG. 2 after performing a masking process.

Referring now to FIG. 3, therein is shown the structure of FIG. 2 after performing a masking process to mask the nFET 120. An oxide layer 300 is formed over the sidewall spacer 200 of the nFET 120 by forming an oxide layer over the surface of the structure shown in FIG. 2. Alternatively, layer 300 can also be formed by nitride. The oxide layer 300 is covered with a photoresist layer 302. The photoresist layer 302 is masked and processed to uncover the pFET 122 while the nFET 120 remains masked. The oxide layer 300 is removed, such as by a wet etch, to uncover the source/drain regions 206 of the pFET 122.

Figure 4:
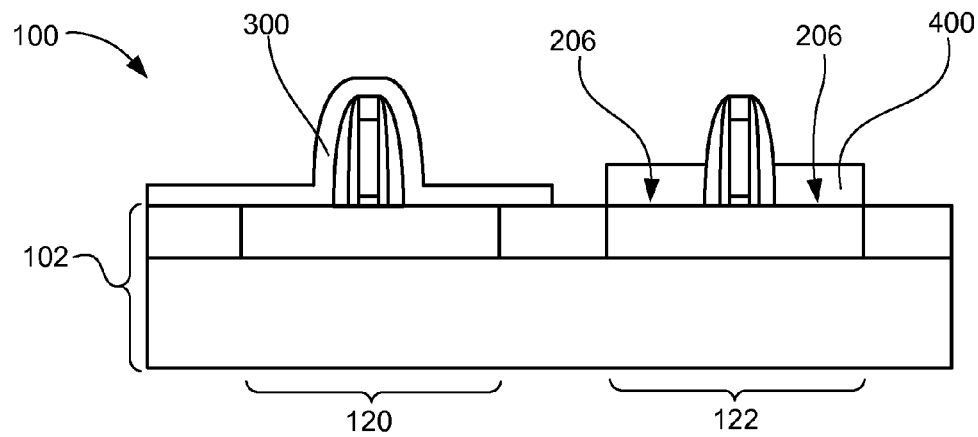
FIG. 4 is the structure of FIG. 3 after epitaxial growth of a SiGe layer.

Referring now to FIG. 4, therein is shown the structure of FIG. 3 after epitaxial growth of a SiGe layer 400 over the source/drain regions 206 of the pFET 122. The photoresist layer 302 shown in FIG. 3 is stripped to expose the oxide layer 300 over the nFET 120. The source/drain regions 206 of the pFET 122 are cleaned. The SiGe layer 400 is epitaxially grown over the source/drain regions 206 of the pFET 122. The epitaxial growth is performed by chemical vapor deposition or molecular beam epitaxy. Preferably, the epitaxial growth is performed by rapid thermal chemical vapor deposition (RTCVD).

Figure 5:
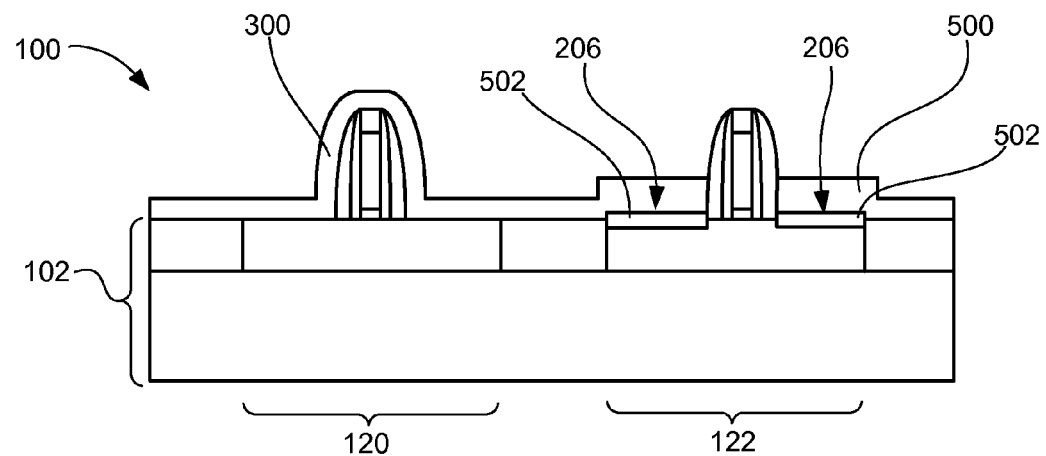
FIG. 5 is the structure of FIG. 4 after formation of a Ge-rich layer.

Referring now to FIG. 5, therein is shown the structure of FIG. 4 after oxidation of the SiGe layer 400 shown in FIG. 4 to form an oxide layer 500 and a Ge-rich layer 502 over the source/drain regions 206 of the pFET 122. The SiGe layer 400 shown in FIG. 4 is subjected to a dry or wet oxidation process, typically at a temperature greater than 850° C. As the SiGe layer 400 shown in FIG. 4 oxidizes, germanium (Ge) atoms are rejected by the second oxide layer 500 thus formed over the source/drain regions 206 of the pFET 122 and driven toward the source/drain regions 206 of the pFET 122 to form the Ge-rich layer 502. It will be appreciated by those skilled in the art that this process of displacing and/or condensing germanium from the SiGe layer 400 may include a germanium condensation process by oxidation of the SiGe layer 400.

Figure 6:
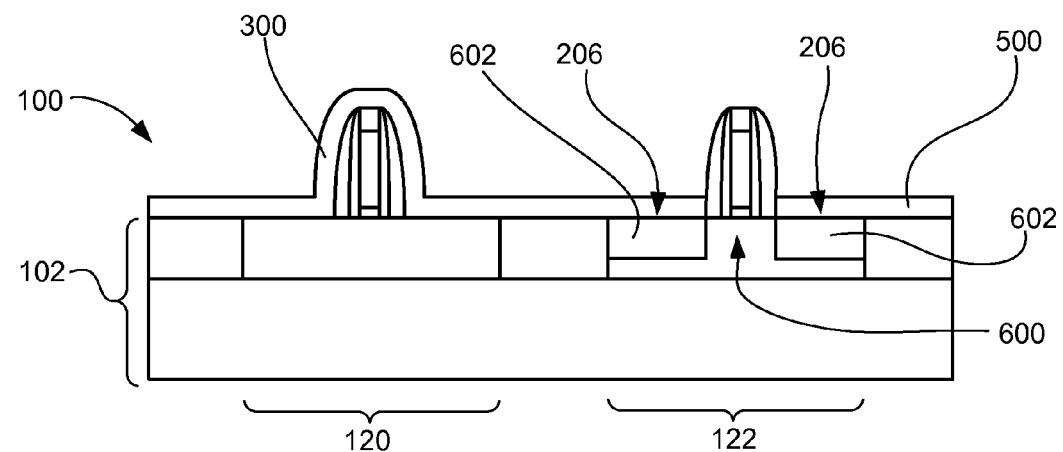
FIG. 6A is the structure of FIG. 6 in which the Ge from the Ge-rich layer shown in FIG. 5 has reached an insulator, extending the source/drains thereto.

Referring now to FIG. 6, therein is shown the structure of FIG. 5 showing diffusion of the Ge-rich layer 502 shown in FIG. 5. As the oxidation process continues, the Ge-rich layer 502 diffuses into the source/drain regions 206 of the pFET 122 to form source/drains 602 therein. The diffusion of Ge into the source/drain regions 206 of the pFET 122 results in a compressive strain occurring in the channel region 600 of the pFET 122.

The resulting semiconductor system 100 is characterized by the absence of a silicon seed layer on the source/drain regions 206 of the pFET 122. Additionally, the semiconductor system 100 is characterized by the absence of germanium in the source/drain regions 206 of the nFET 120.

It has been discovered that the extent of the Si—Ge inter-diffusion into the source/drain regions 206 of the pFET 122 can be controlled depending upon the original thickness of the SiGe layer 400 shown in FIG. 4, the thickness of the silicon semiconductor substrate 102, and the duration of the oxidation process.

Figure 6A:
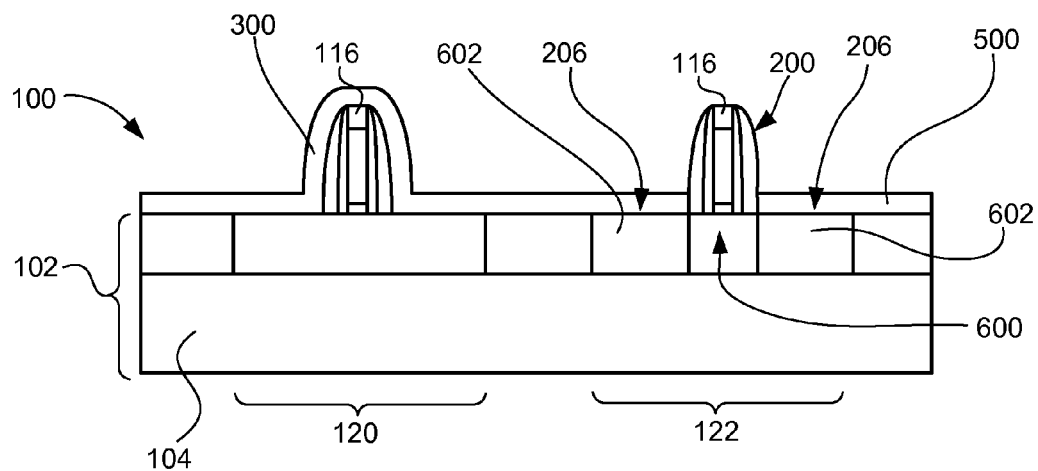

Referring now to FIG. 6A, therein is shown the structure of FIG. 6 in which the Si—Ge inter-diffusion into the source/drain regions 206 of the pFET 122 has extended until the Ge from the Ge-rich layer 502 shown in FIG. 5 has reached the insulator 104, extending the source/drains 602 thereto as well.

Figure 7:
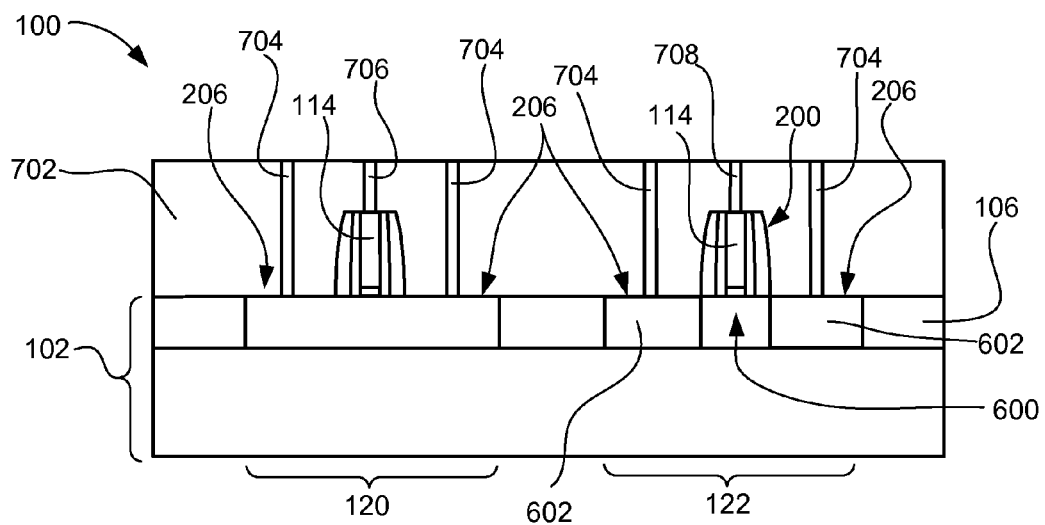
FIG. 7 is the structure of FIG. 6 after formation of a number of contacts in a dielectric layer.

Referring now to FIG. 7, therein is shown the structure of FIG. 6A after formation of a number of contacts in a dielectric layer 702. The oxide layer 300 and the oxide layer 500 shown in FIG. 6A are selectively removed, such as by etching, for example, using a dilute hydrofluoric acid (HF). The oxide layer 300 is removed, such as by etching the oxide layer 300. A hydrofluoric acid (HF) clean may be used to remove the oxide layer 300. Subsequently, an etchant comprising hydrogen peroxide $H_2O_2$ (e.g. 31%) may be used to remove any layer that has Ge content greater than about 65% across the surface of the silicon semiconductor substrate 102. Alternatively, hot water at about 90° C. can be used to remove any layer having a Ge content of greater than about 65% across the surface of the silicon semiconductor substrate 102. Accordingly, the source/drain regions 206 of the pFET 122 are substantially unetched. This cleaning step is not required if there is no Ge remaining on top of the cap dielectric 116 shown in FIG. 6A or on top of insulating spacers 200.

Accordingly, the source/drain regions 206 are substantially unetched. The cap dielectric 116 on the gate 114 of the nFET 120 and the pFET 122 shown in FIG. 1 also needs to be removed using an etching process. The structures of the nFET 120 and the pFET 122 that will serve as locations for the contacts may have a silicide formed over them in a conventional manner.

The ILD layer 702 is formed over the structure and processed using a CMP process to planarize the ILD layer 702. The ILD layer 702 has holes formed through the ILD layer 702 over the various contact areas. The holes in the ILD layer 702 are filled with a suitable conductive material, such as tungsten, to form the contacts.

Thus, a number of source/drain contacts 704 is formed through the ILD layer 702 in contact with the source/drain regions 206. A first gate contact 706 is formed through the ILD layer 702 in contact with the gate 114 of the nFET 120. A second gate contact 708 is formed through the ILD layer 702 in contact with the gate 114 of the pFET 122. It will be apparent from a reading of this description that FIG. 7 is for illustration purposes only. The gate contacts 706 and 708 may not be in the same plane as the plane containing the source/drain contacts 704.

Figure 8:
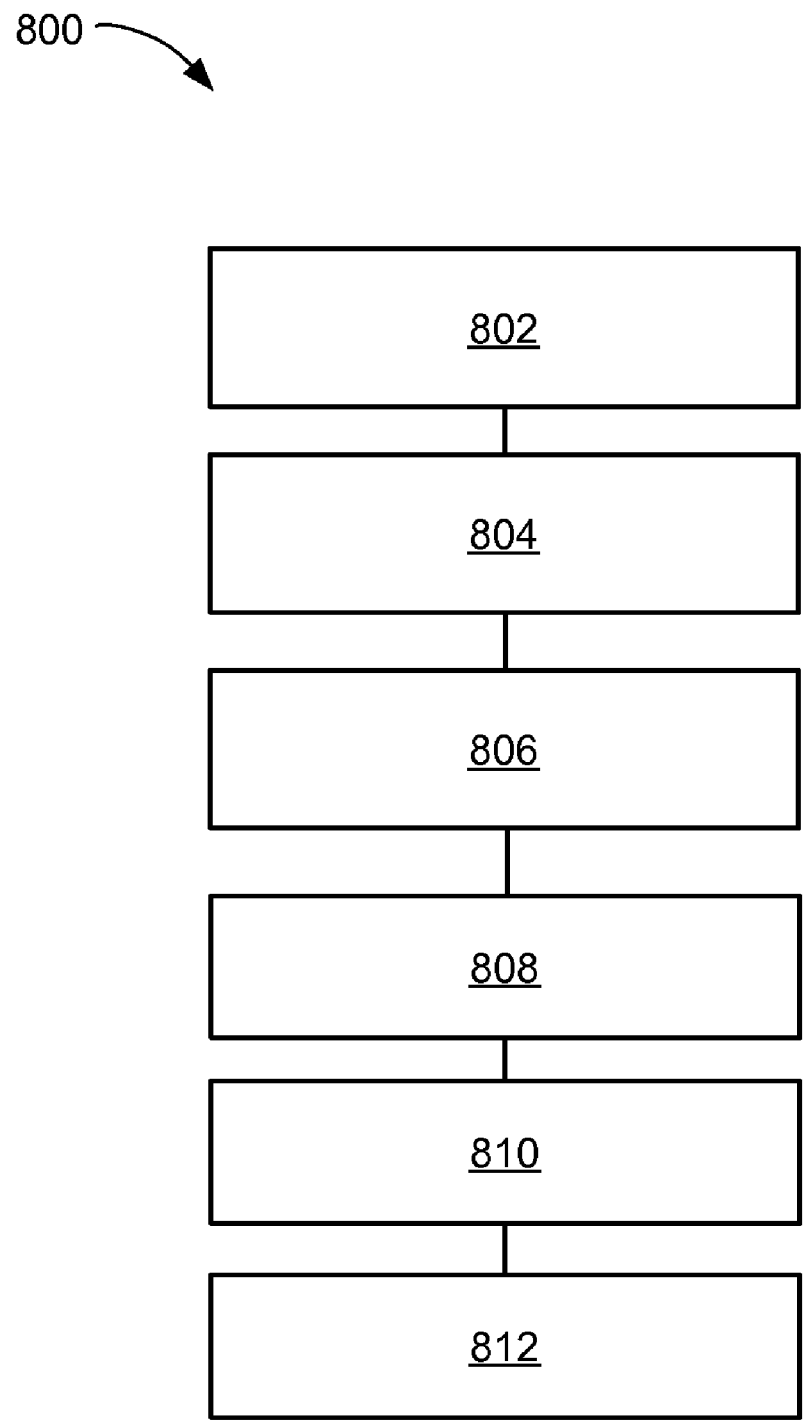
FIG. 8 is a flow chart of a system in accordance with the present invention.

Referring now to FIG. 8, therein is shown a flow chart of a semiconductor system 800 in accordance with the present invention. The system 800 includes providing a silicon semiconductor substrate in a block 802; forming a gate and a plurality of source/drain regions on the silicon semiconductor substrate to form at least one pFET in a block 804; forming a silicon-germanium layer over the plurality of source/drain regions in a block 806; condensing the germanium from the silicon-germanium layer to form a plurality of source/drains in the plurality of source/drain regions by forming an oxide layer over the silicon-germanium layer in a block 808; forming an interlevel dielectric layer over the gate and the source/drain regions in a block 810; and forming a plurality of contacts in the interlevel dielectric layer to the gate and the plurality of source/drain regions in a block 812.

Thus, it has been discovered that the semiconductor system of the present invention furnish important and heretofore unavailable solutions, capabilities, and functional advantages for manufacturing semiconductors having strained channels. The resulting process and configurations are straightforward, economical, uncomplicated, highly versatile and effective, use conventional technologies, and are thus readily suited for manufacturing semiconductor devices that are fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A semiconductor method comprising:
providing a substrate;
forming a gate and a plurality of source/drain regions on the substrate to form at least one pFET;
forming a silicon-germanium layer over the plurality of source/drain regions;
condensing the germanium from the silicon-germanium layer to form a plurality of source/drains in the plurality of source/drain regions by forming an oxide layer over the silicon-germanium layer; and controlling silicon-germanium inter-diffusion into the source/drain regions with the thickness of the silicon-germanium layer and the thickness of the substrate.

2. The semiconductor method as claimed in claim 1 wherein:
forming a gate and a plurality of source/drain regions on the substrate to form at least one pFET also forms at least one nFET; and further comprising:
masking the nFET prior to forming a silicon-germanium layer over the source/drain regions of the pFET.

3. The semiconductor method as claimed in claim 1, wherein:
condensing the germanium from the silicon-germanium layer uses an oxidation process.

4. The semiconductor method as claimed in claim 1 wherein:
condensing the germanium from the silicon-germanium layer forms a germanium-rich layer over the plurality of source/drain regions; and further comprising:
driving the germanium into the plurality of source/drain regions.

5. The semiconductor method as claimed in claim 1, wherein:
condensing the germanium from the silicon-germanium layer to form a plurality of source/drains in the plurality of source/drain regions further comprises an annealing process.

6. The semiconductor method as claimed in claim 1, further comprising:
forming an insulating spacer around the gate.

7. A semiconductor method system comprising:
providing a silicon semiconductor substrate;
forming a plurality of n-wells in the silicon semiconductor substrate;
forming a plurality of p-wells in the silicon semiconductor substrate;
forming a plurality of gates and a plurality of source/drain regions adjacent the gates over the plurality of n-wells to form a plurality of pFETs and over the plurality of p-wells to form a plurality of nFETs;
masking the plurality of nFETs;
forming a silicon-germanium layer over the plurality of source/drain regions of the plurality of pFETs;
condensing the germanium from the silicon-germanium layer to form a plurality of source/drains in the plurality of source/drain regions of the plurality of pFETs by forming an oxide layer over the silicon-germanium layer;
controlling silicon-germanium inter-diffusion into the source/drain regions with the thickness of the silicon-germanium layer and the thickness of the silicon semiconductor substrate;
forming an interlevel dielectric layer over the plurality of gates and the plurality of source/drain regions; and
forming a plurality of contacts in the interlevel dielectric layer to the plurality of gates and the plurality of source/drain regions.

8. The semiconductor method as claimed in claim 7, wherein:
condensing the germanium from the silicon-germanium layer uses an oxidation process.

9. The semiconductor method as claimed in claim 7 wherein:
condensing the germanium from the silicon-germanium layer forms a germanium-rich layer over the plurality of source/drain regions of the plurality of pFETs; and further comprising:
driving the germanium into the plurality of source/drain regions of the plurality of pFETs.

10. The semiconductor method as claimed in claim 7, wherein:
condensing the germanium from the silicon-germanium layer to form a plurality of source/drains in the plurality of source/drain regions of the plurality of pFETs further comprises an annealing process.

11. The semiconductor method as claimed in claim 7 wherein:
providing the silicon semiconductor substrate provides at least one of a silicon substrate, a semiconductor-on-insulator substrate, and combinations thereof.

12. The semiconductor method as claimed in claim 7, further comprising:
forming an insulating spacer around the plurality of gates.

13. A method comprising:
providing a substrate;
forming a gate and a plurality of source/drain regions on the substrate to form at least one pFET;
forming a layer including a strain inducing element over the plurality of source/drain regions;
condensing a strain inducing element from the layer including a strain inducing element to form a plurality of source/drains in the plurality of source/drain regions by forming an oxide layer over the layer including a strain inducing element; and
controlling diffusion of the strain inducing element into the source/drain regions with the thickness of the layer including a strain inducing element and the thickness of the substrate.

* * * * *